(12) United States Patent
Tomita et al.

(10) Patent No.: US 6,295,245 B1
(45) Date of Patent: *Sep. 25, 2001

(54) WRITE DATA INPUT CIRCUIT

(75) Inventors: Hiroyoshi Tomita; Tatsuya Kanda, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 140 days.

(21) Appl. No.: 09/385,004

(22) Filed: Aug. 27, 1999

(30) Foreign Application Priority Data

Nov. 18, 1998 (JP) .................................................. 10-327916

(51) Int. Cl.[7] .................................................. G11C 13/00
(52) U.S. Cl. ...................... 365/230.08; 365/222; 365/233
(58) Field of Search ........................ 365/230.08, 230.01, 365/222, 233, 189.05

(56) References Cited

U.S. PATENT DOCUMENTS 6,061,294 * 5/2000 Koshikawa ...................... 365/230.08

* cited by examiner

*Primary Examiner*—Terrell W. Fears
(74) *Attorney, Agent, or Firm*—Arent Fox Kintner Plotkin & Kahn, PLLC (57) ABSTRACT

A write data input circuit for a double data rate (DDR) SDRAM acquires write data at both a rising and falling edge of a clock signal. The input circuit includes a command input buffer for receiving external commands, such as a read, write or refresh command. An external command latch circuit connected to the input buffer latches the external command in sync with a first clock signal. A decoder decodes the latched external command. A write determination circuit also receives the (undecoded) external command and generates an enable signal if the external command is a write command. A data input buffer is activated by the enable signal and receives write data. A data latch circuit latches the write data provided to the data input buffer in sync with a second clock signal.

19 Claims, 8 Drawing Sheets

WRITE DATA INPUT CIRCUIT

BACKGROUND OF THE INVENTION

The present invention relates to semiconductor memory devices, and more particularly, to write data input circuits used in semiconductor memory devices such as double data rate (DDR) SDRAMs.

DDR SDRAMs have been proposed in recent years to further increase the data transmission rate.

A conventional SDRAM acquires an external command in synchronism with a clock signal. If the external command is, for example, a write command, the prior art SDRAM receives the corresponding write data in synchronism with the rising edge of the clock signal.

In contrast, the DDR SDRAM acquires the write data in synchronism with both the rising and falling edges of a data strobe signal. More specifically, the DDR SDRAM acquires the write command in synchronism with the clock signal, and then receives the write data in synchronism with the rising edge of the data strobe signal. The data strobe signal is output at around the time when the clock signal following the clock signal which acquires the write command goes high. Accordingly, the DDR SDRAM acquires the write data at a transmission rate which is two times faster than that of the conventional SDRAM.

Figure 1:
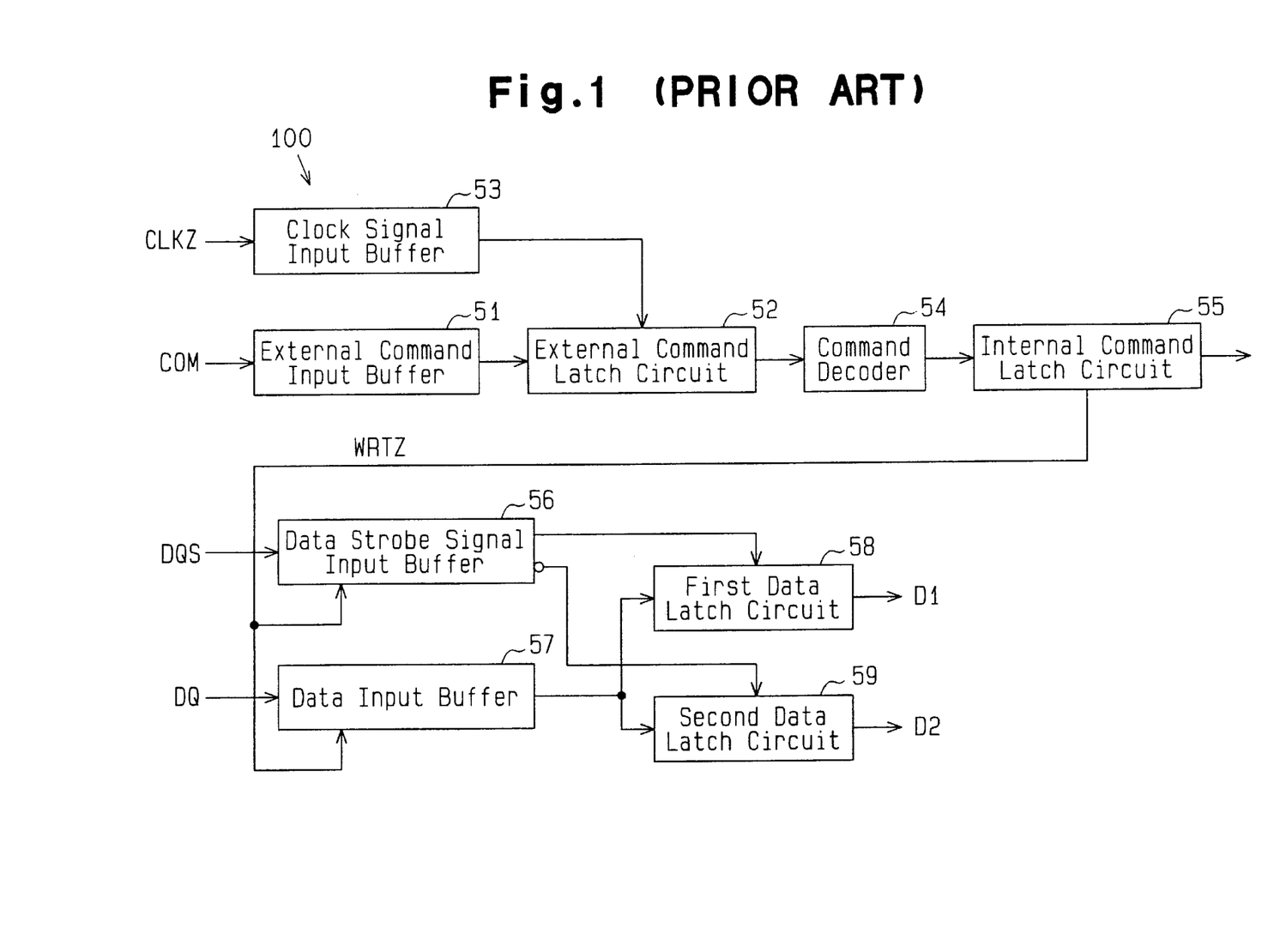
FIG. 1 is a schematic block diagram showing a write data input circuit of a prior art DDR SDRAM.

FIG. 1 is a schematic block diagram showing the DDR SDRAM 100. As shown in FIG. 1, the DDR SDRAM 100 includes an external command input buffer 51, an external command latch circuit 52, a clock signal input buffer 53, a command decoder 54, an internal command latch circuit 55, a data strobe signal input buffer 56, a data input buffer 57, a first data latch circuit 58, and a second data latch circuit 59.

The external command input buffer 51 receives an external command COM from an external device (not shown) and provides the external command COM to the external command latch circuit 52. The external command latch circuit 52 latches the external command COM in synchronism with the rising of the clock signal provided from the clock signal input buffer 53.

The latched command COM is decoded by the command decoder 54. The decoded command COM is latched by the internal command latch circuit 55 as an internal command and provided to an internal circuit.

If the latched internal command is a write command, the internal command latch circuit 55 provides the data strobe signal input buffer 56 and the data input buffer 57 with an enable signal WRTZ. The data strobe signal input buffer 56 is activated in response to the enable signal WRTZ, receives a data strobe signal DQS having a rectangular wave from an external device, and provides the first and second data latch circuits 58, 59 with the data strobe signal DQS.

The data input buffer 57 is also activated by the enable signal WRTZ. The data input buffer 57 sequentially receives write data DQ (D1, D2) from an external device and provides the first and second data latch circuits 58, 59 with the write data DQ (D1, D2) in accordance with the rising and falling edges of the data strobe signal DQS. The first data latch circuit 58 latches the write data DQ (D1) from the data input buffer 57 in synchronism with the rising of the data strobe signal DQS. The second data latch circuit 59 latches the write data DQ (D2) from the data input buffer 57 in synchronism with the falling of the data strobe signal DQS. The latched write data D1, D2 is sent to a DRAM core circuit (not shown) and written to a memory cell at predetermined addresses.

Figure 2:
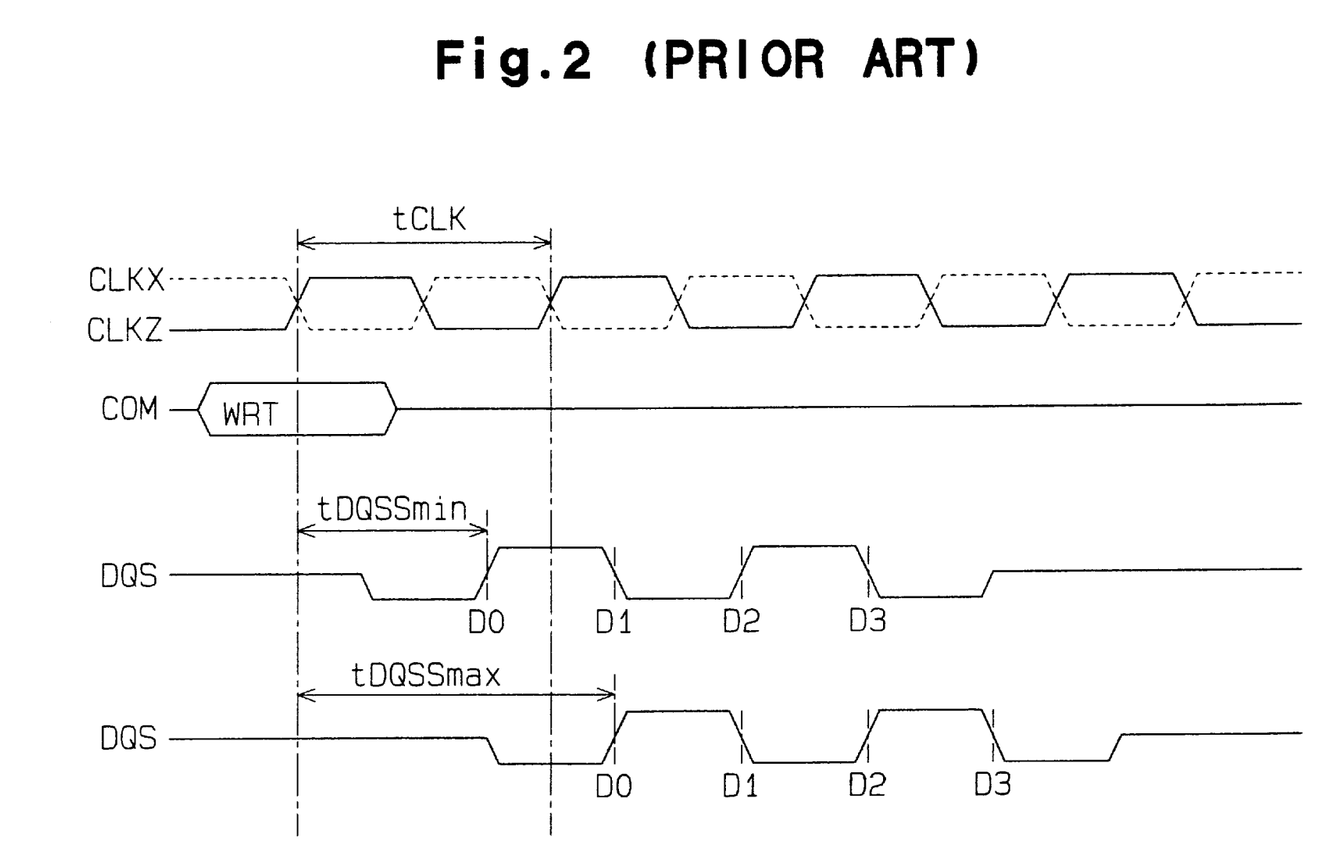
FIG. 2 is a timing chart showing the behavior of a clock signal and data strobe signal of a write command of the DDR SDRRAM of FIG. 1.

FIG. 2 is a timing chart showing the behavior of the clock signal CLKZ and the data strobe signal DQS of the write command. As shown in FIG. 2, the external command COM is latched by the clock signal CLKZ. The data strobe signal DQS rises within a range of ±25% of a single cycle tCLK from the rising of the clock signal CLKZ.

In other words, when a single cycle of the clock signal CLKZ is represented as tCLK, the time between the rising of the clock signal CLKZ that latches the external command COM and the earliest rising of the data strobe signal DQS, or the minimum time tDQSSmin, is represented as tDQSSmin=0.75 tCLK (nanoseconds).

The time until the latest rising of the data strobe signal DQS, or the maximum time tDQSSmax, is represented as tDQSSmax=1.25 tCLK (nanoseconds).

If a single cycle tCLK of the clock signal CLKZ takes ten nanoseconds (the frequency of the clock signal CLKZ being 100 megahertz), the minimum time tDQSSmin and the maximum time tDQSSmax are obtained as described below.

$$tDQSSmin=0.75\ tCLK=7.5\ \text{(nanoseconds)}$$

$$tDQSSmax=1.25\ tCLK=12.5\ \text{(nanoseconds)}$$

Accordingly, the strobe signal input buffer 56 and the data input buffer 57 must be activated presuming that the data strobe signal DQS rises at the minimum time tDQSSmin.

The determination of whether the data strobe signal DQS is low prior to the rising of the strobe signal DQS must be completed by the data strobe signal input buffer 56 before the minimum time tDQSSmin (0.75 tCLK) elapses. Furthermore, since the data strobe signal input buffer 56 is generally formed by a current mirror circuit, a certain amount of time is necessary to activate the data strobe signal input buffer 56 from a deactivated state.

The time necessary for the data strobe input buffer 56 to determine whether the data strobe signal DQS is low can be represented as T11, and the time necessary for activating the data strobe signal input buffer 56 can be represented as T12. In this case, at least time T11+T12 is necessary prior to the rising of the data strobe signal DQS when the data strobe signal input buffer 56 receives the enable signal WRTZ.

In other words, at least a first guarantee time Ta is necessary from when the clock signal CLK, which latched the write command, rises to when the enable signal WRTZ rises. This can be represented as Ta=0.75 tCLK—(T11+T12) (nanoseconds).

If a single cycle tCLK of the clock signal CLKZ takes ten nanoseconds, the first guarantee time Ta is obtained as described below.

$$Ta=7.5-(T11+T12)(\text{nanoseconds})$$

The setup time of the first and second data latch circuits 58, 59 must be provided for between the activation of the data input buffer 57 and the rising of the data strobe signal DQS. Furthermore, in the same manner as the data strobe signal input buffer 56, the data input buffer 57 is generally formed by a current mirror circuit and requires a certain amount of time before activation.

The setup time of the first and second data latch circuits 58, 59 may be represented as T21 and the time necessary for activating the data input buffer 57 may be represented as T22. In this case, at least time T21+T22 is necessary prior to the rising of the data strobe signal DQS when the data input buffer 57 receives the enable signal WRTZ.

In other words, at least a second guarantee time Tb is necessary from when the clock signal CLK, which latched the write command, rises to when the enable signal WRTZ rises. This can be represented as Tb=0.75 tCLK−(T21+T22) (nanoseconds).

If a single cycle tCLK of the clock signal CLKZ takes ten nanoseconds, the second guarantee time Tb is obtained as described below.

$$Tb=7.5-(T21+T22) \text{(nanoseconds)}$$

The time from when the clock signal CLK, which has latched the write command, rises to when the enable signal WRTZ is output, or the accumulated delay time Tc, is determined by a delay time T31 of the external command input buffer 51 and the clock signal input buffer 53, a latching time T32 of the external command latch circuit 52, a decoding time T33 of the command decoder 54, and the latching time T34 of the internal command latch circuit 55.

In other words, the accumulated delay time Tc can be represented as Tc=T31+T32+T33+T34 (nanoseconds).

If T11 takes 0.5 nanoseconds and T12 takes 1.5 nanoseconds when a single cycle of the clock signal CLKZ takes ten nanoseconds (the frequency being 100 megahertz), the first guarantee time Ta is obtained as described below.

$$Ta=7.5-(0.5+1.5)=5.5 \text{ (nanoseconds)}$$

If T21 takes 0.5 nanoseconds and T22 takes 1.5 nanoseconds, the second guarantee time is obtained as described below.

$$Tb=7.5-(0.5+1.5)=5.5 \text{ (nanoseconds)}$$

Furthermore, if T31 through T33 each take two nanoseconds, and if T34 takes one nanosecond, the accumulated time Tc is obtained as described below.

$$Tc=2+2+2+1=7$$

Accordingly, there is a relationship of Tc>Ta and Tc>Tb.

In other words, the enable signal WRTZ is provided to the data strobe signal input buffer 56 and the data input buffer 57 with a delay of 1.5 nanoseconds from the first and second guarantee time Ta, Tb (5.5 nanoseconds). As a result, the input buffers 56, 57 may not be able to acquire the write date D1 in response to the rising of the data strobe signal DQS.

For guaranteed operation, each of the input buffers 56, 57 and the data latch circuits 58, 59 are activated prior to the first and second guarantee time Ta, Tb. More specifically, the input buffers 56, 57 and the data latch circuits 58, 59 are activated in response to an activate command provided by an external device before the write command is provided The activate command is provided a few clock signals before the write command. Thus, the operation is guaranteed since the input buffers 56, 57 and the data latch circuit 58, 59 are activated with a margin.

However, since the input buffers 56, 57 and the data latch circuits 58, 59 are activated a few clock signals before the write command, unnecessary current flows through the input buffers 56, 57 and the data latch circuits 58, 59. Further, the input buffers 56, 57 and the data latch circuit 58, 59 are always activated in response to the activate command even if the write command is not provided. Thus, unnecessary current is continuously consumed.

SUMMARY OF THE INVENTION

It is an objective of the present invention to provide low power consumption input circuit that acquires data accurately.

To achieve the above objective, the present invention provides a semiconductor memory device comprising a command input buffer, an external command latch circuit, a decoder, a write command determination circuit, and a data strobe input buffer. The command input buffer receives an external command. The external command latch circuit is connected to the command input buffer, and latches the external command from the command input buffer synchronous with a first clock signal. The decoder is connected to the external command latch circuit, and receives the latched external command, and decodes the external command to generate a command. The write command determination circuits receive the external command and generate a first enable signal when the external command is a write command. The data strobe input buffer is activated by the first enable signal from the write command determination circuits, and receives a data strobe signal.

The present invention further provides a semiconductor memory device comprising a command input buffer, an external command latch circuit, a decoder, an internal command latch circuit, a write command determination circuits, a data strobe input buffer, and a clock signal input buffer. The command input buffer receives an external command. The external command latch circuit is connected to the command input buffer, latches the external command from the command input buffer synchronous with a first clock signal. The decoder is connected to the external command latch circuit, receives the Latched external command, and decodes the external command to generate an internal command. The internal command latch circuit is connected to the decoder, latches the internal command from the decoder. The write command determination circuits receives the external command and generate a first enable signal when the external command is a write command. The data strobe input buffer is activated by the first enable signal from the write command determination circuit, and receives a data strobe signal. The clock signal input buffer that is activated by the first enable signal from the write command determination circuit, and receives a second clock signal.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together the accompanying drawings in which:

DETAILED DESCRIPTION OF THE PREFERRED EMBODIMENTS

First Embodiment

A semiconductor memory device according to a first embodiment of the present invention will now be described with reference to FIGS. 3 to 6.

Figure 3:
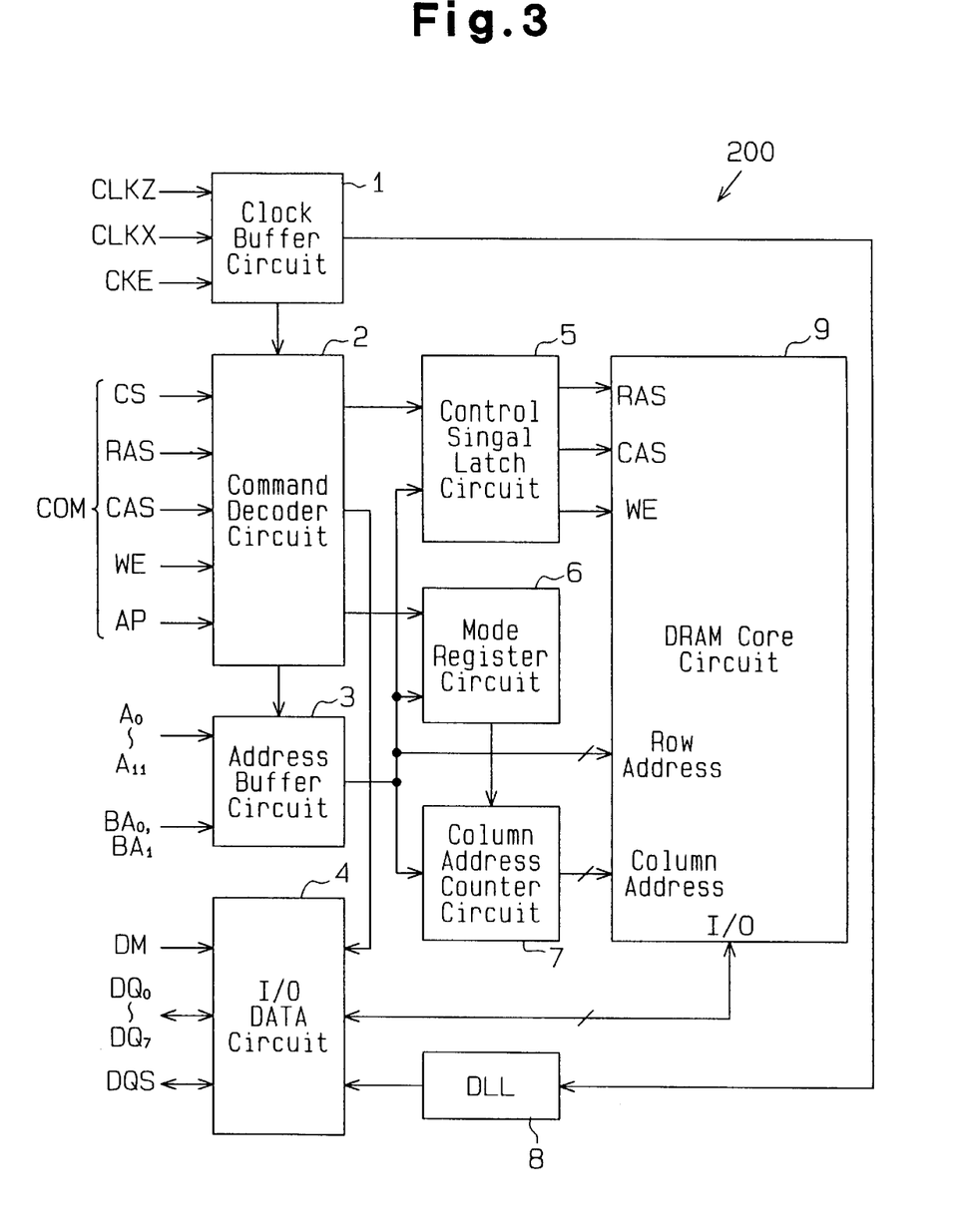
FIG. 3 is a schematic block diagram showing a DDR SDRAM according to a first embodiment of the present invention.

The semiconductor memory device, or preferably DDR SDRAM 200, includes a clock buffer circuit 1, a command decoder circuit 2, an address buffer circuit 3, an input-output data circuit 4, a control signal latch circuit 5, a mode register circuit 6, a column address counter circuit 7, a delay locked loop (DLL) circuit 8, and a DRAM core circuit 9.

The clock buffer circuit 1 receives a power-down signal CKE and first and second external clock signals CLKZ, CLKX, which phases differ from each other by 180°, from an external device (not shown) and provides these signals to the command decoder circuit 2 and the DLL circuit 8. In the first embodiment, a single cycle tCLK of the clock signal CLKZ preferably takes ten nanoseconds (the frequency being 100 megahertz)

The command decoder circuit 2 receives an external command COM from an external device in response to the clock signal CLKZ from the clock buffer circuit 1. The external command COM includes a column address strobe signal CAS, a write enable signal WE, a chip select signal CS, a row address strobe signal RAS, and an auto precharge enable signal AP. The command decoder circuit 2 decodes the external command COM in response to the clock signal CLKZ based on the status (high or low) of each of the signals CAS, WE, CS, RAS, AP to generate commands, such as a write command and a read command. The command decoder circuit 2 sends the decoded commands, as an internal command and an enable signal, to the address buffer circuit 3, the input-output data circuit 4, the control signal latch circuit 5, and the mode register circuit 6.

The address buffer circuit 3 receives address signals $A_0$–$A_{11}$ and bank addresses $BA_0$–$BA_1$ from the external device in accordance with the internal command, which is sent from the command decoder circuit 2. The address buffer circuit 3 sends address data derived from the address signals $A_0$–$A_{11}$ and the bank addresses $BA_0$–$BA_1$ to the control signal latch circuit 5, the mode register circuit 6, and the column address counter circuit 7. The address buffer circuit 3 also sends row address data derived from the address signals $A_0$–$A_{11}$ to the DRAM core circuit 9.

The input-output data circuit 4 is activated by the enable signal from the command decoder circuit 2 and receives a data strobe signal DQS (data sampling clock signal), write data $DQ_0$–$DQ_7$, and a data mask signal DM from the external device. The input-output data circuit 4 latches the write data $DQ_0$–$DQ_7$ in response to the rising and falling edges of the data strobe signal DQS and sends the latched write data $DQ_0$–$DQ_7$ to the DRAM core circuit 9.

Furthermore, the input-output data circuit 4 sends the read data $DQ_0$–$Q_7$ from the DRAM core circuit 9 to the external device in accordance with the internal command from the command decoder circuit 2.

The control signal latch circuit 5 receives the internal command from the command decoder circuit 2 and the address data from the address buffer circuit 3, writes the data of the DRAM core circuit 9 in accordance with the internal command and the address data, reads the data, and outputs control signals for performing various processes, such as a refresh.

The mode register circuit 6 receives the internal command from the command decoder circuit 2 and the address data from the address buffer circuit 3 and maintains the processing mode of the DRAM core circuit 9 in accordance with the internal command and the address data.

The column address counter circuit 7 receives the column address data, which is derived from the address signals $A_0$–$A_{11}$, from the address buffer circuit 3 and sends the column address data to the DRAM core circuit 9 in accordance with the mode maintained by the mode register circuit 6.

The DLL circuit 8 receives the first and second internal clock signals CLKMZ, CLKMX from the clock buffer circuit. 1 and generates clock signals having different frequencies. These generated clock signals are sent to the input-output data circuit 4.

The DRAM core circuit 9 receives the row address data from the address buffer circuit 3, control signals from the control signal latch circuit 5, and the column address data from the column address counter circuit 7. The DRAM core circuit 9 writes data to a memory array in accordance with the control signals and the address data, reads the data, and performs processes, such as a refresh. That is, the DRAM core circuit 9 writes the write data $DQ_0$–$DQ_7$ to a memory cell at predetermined addresses in accordance with the control signals and the address data.

Figure 4:
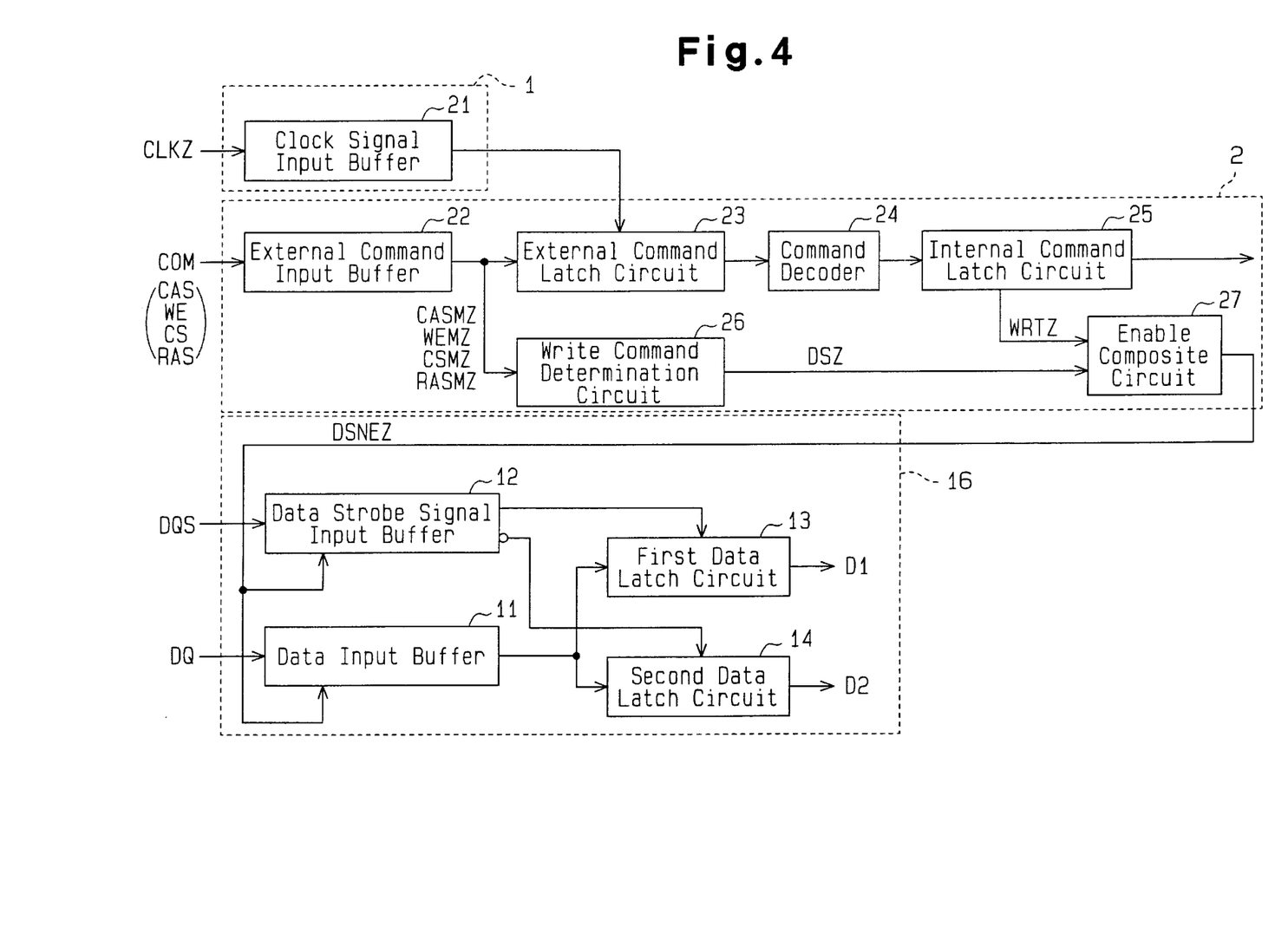
FIG. 4 is a schematic block diagram showing a write data input circuit of the DDR SDRAM of FIG. 3.

FIG. 4 shows a write data input circuit 16, which is included in the input-output data circuit 4 and which receives write data from the external device. A write data input circuit 16 is provided for each of the eight bits of the write data $DQ_0$–$DQ_7$. Each of the eight write data input circuits 16 have the same structure. Accordingly, only one write data input circuit 16 will be described. Furthermore, for the sake of brevity, the write data $DQ_0$–$DQ_7$ will simply be described as write data DQ.

As shown in FIG. 4, the write data input circuit 16 includes a data input buffer 11, a data strobe signal input buffer 12, a first data latch circuit 13, and a second data latch circuit 14.

The data input buffer 11 is activated in response to a high enable signal DSENZ from the command decoder circuit 2 to receive the write data DQ (D1, D2, D3, . . . ) from the external device and provide the data DQ (D1, D2, D3, . . . ) to the first and second data latch circuits 13, 14.

Figure 6:
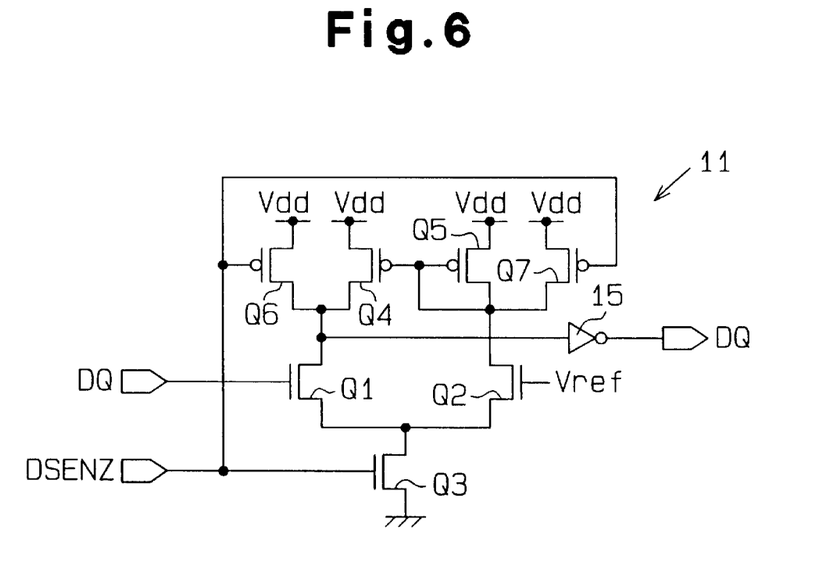
FIG. 6 is a circuit diagram showing a data input buffer of the write data input circuit of FIG. 4.

As shown in FIG. 6, the data input buffer 11, which is preferably a current mirror type buffer circuit, includes n-channel MOS transistors Q1, Q2, which form a differential amplifying portion, an NMOS transistor Q3, which forms a constant current portion, and p-channel MOS transistors Q4, Q5, which form a current mirror portion. The sources of the amplifying NMOS transistors Q1, Q2 are grounded by way of the NMOS transistor Q3.

The drain of the NMOS transistor Q1 is connected to a high power supply Vdd by way of the PMOS transistor Q4. Further, the drain of the NMOS transistor Q1 is connected to the first and second data latch circuits 13, 14 by way of an inverter circuit 15. The drain of the NMOS transistor Q2 is connected to a high potential power supply Vdd by way of the PMOS transistor Q5. The PMOS transistors Q4, Q5 are each connected in parallel to control PMOS transistors Q6, Q7, respectively. The PMOS transistors Q4, Q5 have gates connected to the drain of the NMOS transistor Q2.

The gate of the NMOS transistor Q1 is provided with the write data DQ (D1, D2, D3, . . . ). The gate of the NMOS transistor Q2 is provided with a reference voltage Vref. The gates of the NMOS transistor Q3 and the PMOS transistors Q6, Q7 are provided with the enable signal DSENZ. If the enable signal DSENZ is low, the PMOS transistors Q6, Q7 go ON, the NMOS transistor Q3 goes OFF, and the data input buffer 11 is deactivated. In this state, the data input buffer 11 does not function and the output signal of the inverter circuit 15 is always low.

If the enable signal DSENZ is high, the PMOS transistors Q6, Q7 go OFF and the NMOS transistor Q3 goes ON. This activates the data input buffer 11. The time from when the enable signal DSENZ rises to when the data input buffer 11 is activated (activating time T22) is about 1.5 nanoseconds.

It is necessary to allow for the setup time T21 of the first and second data latch circuits 13, 14, prior to the rising of the data strobe signal DQS, before activating the data input buffer 11. In the first embodiment, the setup time T21 is about 0.5 nanoseconds.

Accordingly, the second guarantee time Tb is obtained as described below.

$$Tb = 0.75tCLK - (T21 + T22)$$
$$= 7.5 - (0.5 + 1.5)$$
$$= 5.5 \text{ (nanoseconds)}$$

Thus, the data input buffer 11 must be provided with a high enable signal DSENZ within 5.5 nanoseconds from the input of the write command.

In the activated state, if the NMOS transistor Q1 receives a high write data DQ (having a potential higher than the reference voltage Vref), the potential at the drain of the NMOS transistor Q1 decreases, and the output signal of the inverter circuit 15 is set at a high level. If the NMOS transistor Q1 receives a low write data DQ (having a potential lower than the reference voltage Vref), the potential at the drain of the NMOS transistor Q1 increases, and the output signal of the inverter circuit 15 is set at a low level. That is, the activated data input buffer 11 provides the write data DQ to the first and second data latch circuits 13, 14 in the same form it received the write data DQ from the external device.

With reference to FIG. 4, the data strobe signal input buffer 12 is activated when the enable signal DSENZ from the command decoder circuit 2 rises, receives the data strobe signal DQS (data sampling signal) from the external device, and provides the data strobe signal DQS as a latch signal to the first and second data latch circuits 13, 14.

The data strobe signal input buffer 12 has substantially the same circuit structure as the data input buffer 11 of FIG. 6, but differs in that the gate of the transistor Q1 is provided with the data strobe signal DQS instead of the write data DQ. Thus, when the enable signal DSENZ is low, the data strobe signal input buffer 12 is deactivated and always outputs a low signal.

If the enable signal DSENZ rises, the data strobe signal input buffer 12 is activated. Like the data input buffer 11, the time from when the enable signal DSENZ rises to when the data strobe signal input buffer 12 is activated (activating time T12) is about 1.5 nanoseconds.

The activated data strobe signal input buffer 12 first determines whether the data strobe signal DQS, prior to the rising, is low. It takes about 0.5 nanoseconds to determine whether or not the data strobe signal DQS is low.

Accordingly, the first guarantee time Ta is obtained as described below.

$$Ta = 0.75tCLK - (T11 + T12)$$
$$= 7.5 - (0.5 + 1.5)$$
$$= 5.5 \text{ (nanoseconds)}$$

Thus, the data strobe signal input buffer 12 must be provided with a high enable signal DSENZ within 5.5 nanoseconds from the input of the write command.

The activated data strobe signal input buffer 12 outputs a high signal in response to a high data strobe signal DQS (the potential being higher than the reference voltage Vref). On the other hand, the data strobe signal input buffer 12 outputs a low signal in response to a low data strobe signal DQS (the potential being lower than the reference voltage Vref). That is, the activated data strobe signal input buffer 12 provides the data strobe signal DQS to the first and second data latch circuits 13, 14 in the same form it received the data strobe signal DQS from the external device.

The first data latch circuit 13 latches the write data DQ (D1) from the data input buffer 11 in response to the rising edge of the data strobe signal DQS from the data strobe signal input buffer 12. The latched write data DQ (D1) is provided to the DRAM core circuit 9.

The second data latch circuit 14 latches the write data DQ (D2) from the data input buffer 11 in response to the falling edge of the data strobe signal DQS from the data strobe signal input buffer 12. The latched write data DQ (D2) is provided to the DRAM core circuit 9.

A circuit for generating the enable signal DSENZ, which activates the data input buffer 11 and the data strobe signal input buffer 12, will now be described with reference to FIG. 4.

The clock buffer circuit 1 includes a clock input buffer 21. The clock input buffer 21 receives the clock signal CLKZ and outputs the clock signal CLKZ as a latch signal. The clock input buffer 21 has substantially the same circuit structure as the data input buffer 11 of FIG. 6, but differs in that the gate of the transistor Q1 is provided with the clock signal CLKZ instead of the write data DQ and in that the gates of the transistors Q3, Q6, Q7 are provided with the power-down signal CKE instead of the enable signal DSENZ.

Thus, when the power-down signal CKE is low, the clock input buffer 21 is deactivated and always outputs a low signal.

When the power-down signal CKE rises, the clock input buffer 21 is activated. This causes the clock input buffer 21 to receive the clock signal CLKZ and provide the clock signal CLKZ to the external command latch circuit 23. In the clock input buffer 21, the time from the receipt of the clock signal buffer 21 to the output of the clock signal CLKZ (delay time Td0) is approximately 2.0 nanoseconds.

The command decoder circuit 2 includes an external command input buffer 22, an external command latch circuit 23, a command decoder 24, an internal command latch circuit 25, a write command determination circuit 26, and an enable composite circuit 27.

The external command input buffer 22 receives the external command COM, which includes the column address strobe signal CAS, the write enable signal WE, the chip select signal CS, and the row address strobe signal RAS, and provides the external command COM to the external command latch circuit 23 and the write command determination circuit 26. The external command input buffer 22 includes four input buffers (not shown). Each input buffer has substantially the same circuit structure as the data input buffer 11 of FIG. 6, but differs in that the gate of the associated transistor Q1 is provided with the column address strobe signal CAS, the write enable signal WE, the chip select signal CS, or the row address strobe signal RAS instead of the write data DQ and in that the gates of the associated transistors Q3, Q6, Q7 are provided with the power-down signal CKE instead of the enable signal DSENZ. Thus, if the power-down signal CKE is low, the external command input buffer 22 is deactivated and always outputs a low signal.

When the power-down signal CKE rises, the external command input buffer 22 is activated. This causes the external command input buffer 22 to receive the external command COM, which includes the column address strobe signal CAS, the write enable signal WE, the chip select signal CS, and the row address strobe signal RAS, and provide the external command COM to the external command latch circuit 23. In the external command input buffer 22, the time from the receipt of the external command COM to the output of the external command COM (delay time Td1) is about two nanoseconds.

The external command latch circuit 23 latches the external command COM from the external command input buffer 22 in response to the rising edge of the clock signal CLKZ from the clock input buffer 21. The external command latch circuit 23 includes four latch circuits. Each latch circuit latches a column address strobe signal CASMZ, a write enable signal WEMZ, a chip select signal CSMZ, or a row address strobe signal RASMZ, all of which are included in the external command latch circuit 23. The external command latch circuit 23 provides the latched external command COM to the command decoder 24. In the external command latch circuit 23, the time from the latching of the external command COM to the output of the external command COM (delay time Td2) is about two nanoseconds.

Figure 9:
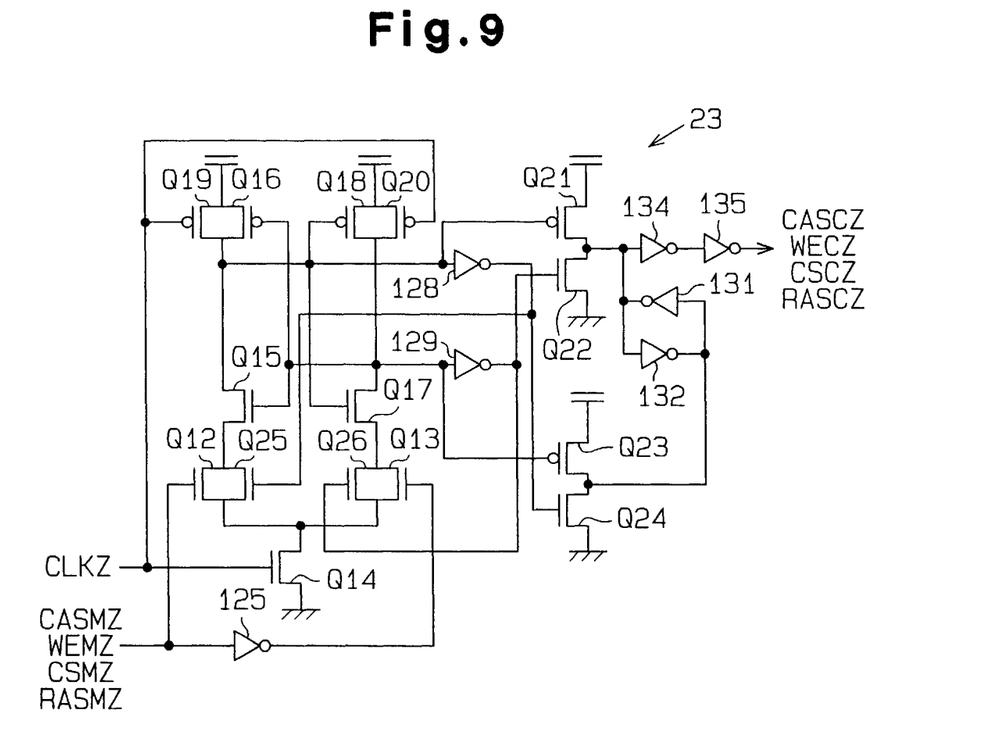
FIG. 9 is a circuit diagram showing an external command latch circuit of the write data input circuit of FIG. 4.

Referring to FIG. 9, the external command latch circuit 23 comprises transistors Q12–Q26 and inverters 125, 128, 129, 131, 132, 135. The external command latch circuit 23 receives command signals CASMZ, WEMZ, CSMZ, RASMZ in accordance with clock signal CLKZ and generates latch command signals CASCZ, WECZ, CSCZ, RASCZ.

Referring again to FIG. 4, the command decoder 24 decodes the external command COM (the four signals CASMZ, WEMZ, CSMZ, and RASMZ) to generate various commands such as a write command, a read command, and a refresh command. These commands are provided to the internal command latch circuit 25 as internal commands. In the command decoder 24, the time from the receipt of the external command COM to the output of the internal command (delay time Td3) is two nanoseconds.

Figure 10:
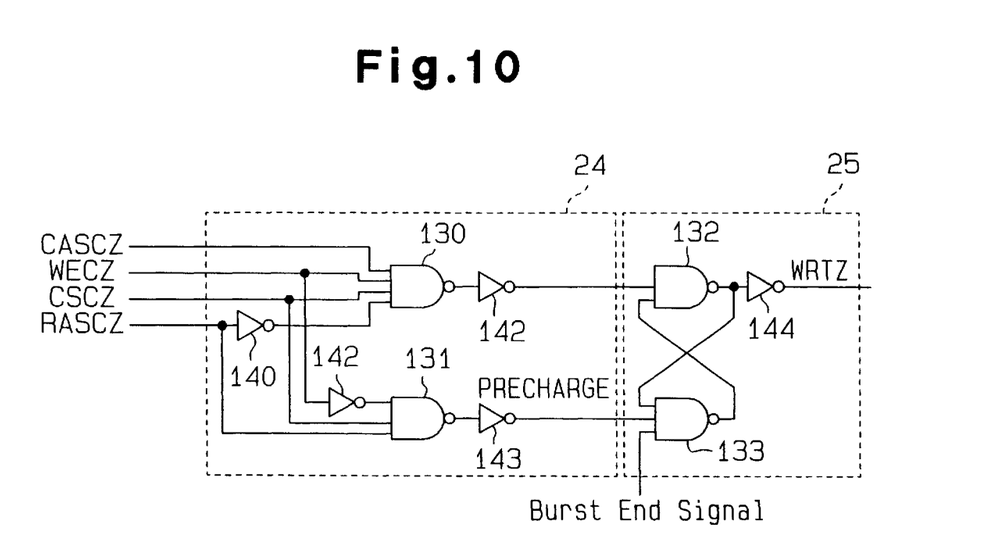
FIG. 10 is a circuit diagram showing a command decoder and an Internal command latch circuit of the write data input circuit of FIG. 4.

Referring to FIG. 10, the command decoder 24 comprises NAND circuits 130, 131 and inverters 140–143. The NAND circuit 130 receives the latch commands CASCZ, WECZ, CSCZ, RASCZ, and generates the write command. The NAND circuit 131 receives the latch commands WECZ, CSCZ, RASCZ, and generates a precharge signal.

Referring again to FIG. 4, the internal command latch circuit 25 receives the internal command from the command decoder 24 and provides the internal command to the control signal latch circuit 5 and the mode register circuit 6. If the internal command is a write command, the internal command latch circuit 25 provides a high second write enable signal WRTZ, which indicates that the write command is lathed, to the enable composite circuit 27. In the internal command circuit 25, the time from the receipt of the internal command (write command) to the output of the write enable signal WRTZ (delay time Td4) is about one nanosecond.

Referring to FIG. 10, the internal command latch circuit 25 comprises NAND circuits 132, 133 and an inverter 144. Each of the NAND circuits 132, 133 has an input terminal connected to an output terminal of other NAND circuit 132, 133. The NAND circuit 132 receives the command from the command decoder 24, and the NAND circuit 133 receives the precharge signal from the command decoder 24 and a burst end signal from a counter circuit (not shown). The counter circuit, which counts the burst length, generates the burst end signal.

Referring again to FIG. 4, the write command determination circuit 26 receives the external command COM from the external command input buffer 22 and provides the enable composite circuit 27 with a high first write enable signal DSZ when the external command COM is a write command.

In the first embodiment, the write command is determined when the column address strobe signal CASMZ, the write enable signal WEMZ, and the chip select signal CSMZ are high while the row address strobe signal RASMZ is low.

Figure 5:
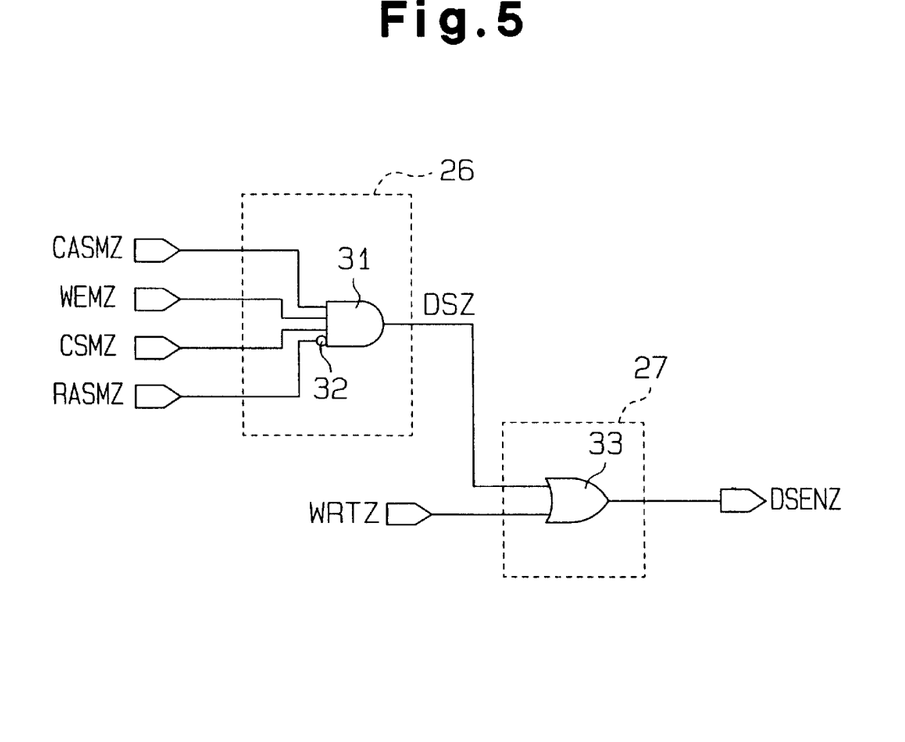
FIG. 5 is a circuit diagram showing a determination circuit and an enable composite circuit of the write data input circuit of FIG. 4.

As shown in FIG. 5, the write command determination circuit 26 includes an AND circuit 31 and an inverter circuit 32. The AND circuit 31 has four input terminals to receive the column address strobe signal CASMZ, the write enable signal WEMZ, the chip select signal CSMZ, and the row address strobe signal RASMZ. The row address strobe signal RASMZ is received by way of the inverter circuit 32. The write command determination circuit 26 outputs a high first write enable signal DSZ when the row address strobe signal RASMZ is low while the other signals CASMZ, WEMZ, CSMZ are high. In the write command determination circuit 26, the time from the receipt of the external command COM (signals CASMZ, WEMZ, CSMZ, RASMZ) to the output of the first write enable signal DSZ (delay time Td5) is about one nanosecond.

The enable composite circuit 27 preferably includes an OR circuit 33. The OR circuit 33 has two input terminals for receiving a first write enable signal DSZ from the write command determination circuit 26 and a second write enable signal WRTZ from the internal command latch circuit 25. The OR circuit 33 (enable composite circuit 27) provides the data input buffer 11 and the data strobe signal input buffer 12 with a high enable signal DSENZ when receiving either the high first write enable signal DSZ or the high second write enable signal WRTZ. In the enable composite circuit 27, the time from the receipt of the first write enable signal DSZ or the second write enable signal WRTZ to the output of the enable signal DSENZ (delay time Td6) is about 0.5 nanoseconds.

The time DT1 necessary from when the external command input buffer 22 receives the write command to when the enable composite circuit 27 outputs the enable signal DSENZ in response to the first write enable signal DSZ is obtained from the sum of the delay time Td1 of the external command input buffer 22, the delay time Td5 of the write command determination circuit 26, the delay time Td6 of the enable composite circuit 27, and the setup time (−0.15 tCKL) for the clock signal CLKZ of the external command (write command). The setup time (−0.15 tCLK) must be taken into consideration because the external command (write command) has already been provided to the external command input buffer 22 during the setup time prior to the rising of the clock signal CLKZ, which acquires the external command.

Accordingly, the time DT1 is obtained as described below.

$$DT1 = Td1 + Td5 + Td6 - 0.15tCKL$$
$$= 2 + 1 + 0.15 - 1.5$$
$$= 2.0 \text{ (nanoseconds)}$$

The time DT2 necessary from when the external command input buffer 22 receives the write command to when the enable composite circuit 27 outputs the enable signal DSENZ in response to the second write enable signal WRTZ is obtained from the sum of the delay time Td1 of the external command input buffer 22, the delay time Td2 of the external command latch circuit 23, the delay time Td3 of the command decoder 24, the delay time Td4 of the internal command latch circuit 25, and the delay time Td6 of the enable composite circuit 27.

Accordingly, the time DT2 is obtained as described below.

$$DT2 = Td1 + Td2 + Td3 + Td4 + Td6$$
$$= 2 + 2 + 2 + 2 + 0.5$$
$$= 8.5 \text{ (nanoseconds)}$$

Thus, the time DT1 (2.0 nanoseconds) is shorter than time DT2 (8.5 nanoseconds) by 6.5 nanoseconds.

The first write enable signal DSZ is generated through the external command input buffer 22 and the write command determination circuit 26, while the second write enable signal WFTZ is generated through the external command input buffer 22, the external command latch circuit 23, the command decoder 24, and the internal command latch circuit 25. In this manner, the less number of circuits though which each signal passes results in the first write enable signal DSZ being provided to the enable composite circuit 27 earlier than the second write enable signal WPTZ. In addition, as apparent from FIG. 5, due to the simple structure of the write command determination circuit 26, which is formed by the AND circuit 31 and the inverter circuit 32, the delay time Td5 of the write command determination circuit 26 is short and takes only 1 nanosecond.

Due to the simple structure of the enable composite circuit 27, which is formed by the OR circuit 33, the delay time Td6 of the enable composite circuit 27 is also short and takes only 0.5 nanoseconds.

As a result, when the external command input buffer 22 is provided with the write command, the enable signal DSENZ is sent to the input buffers 11, 12 within the time DT1 (2.0 nanoseconds). That is, the enable signal DSENZ is provided to the input buffers 11, 12 within the time DT1 (2.0 nanoseconds) which is shorter than the first and second guarantee time Ta, Tb (5.5 nanoseconds).

Thus, the input buffers 11, 12 and the data latch circuits 13, 14 are each activated with a time margin, guaranteeing their operation. In addition, there is a margin of about 3.5 nanoseconds between the generating time DT1 of the enable signal DSENZ (2.0 nanoseconds) and the first and second guarantee time Ta, Tb (5.5 nanoseconds). Hence, the frequency of the clock signal CLKZ can be further increased.

In the first embodiment, the enable signal DSENZ is generated based on the write command. Accordingly, the unnecessary operation time of the input buffers 11, 12 and the data latch circuits 13, 14 is decreased and the current consumption is decreased in comparison to the conventional devices which use activate commands that undergo resistance before the write command.

In the first embodiment, the enable composite circuit 27 (OR circuit 33) outputs the enable signal DSENZ in response to either a high first write enable signal DSZ or a high second write enable signal WRTZ. When the writing operation is still being performed, the input of a new external command COM following the current write command invalidates the first write enable signal DSZ. In this state, the continuously output second write enable signal WRTZ keeps the input buffers 11, 12 activated. This guarantees the operation of the input buffers 11, 12 until the writing operation is completed.

The semiconductor memory device may operates in a burst write mode like the conventional SDRAM. In this case, the data strobe signal input buffer 56 and the data input buffer 57 must be activated for a predetermined time period from the command input. The data strobe signal input buffer 56 and the data input buffer 57 are kept activated for the predetermined time period by the enable signal WRTZ from the internal command latch circuit 25.

Furthermore, the simple structure of the write command determination circuit 26 and the enable composite circuit 27 shortens the delay time Td5, Td6 and reduces the generating time DT1 of the enable signal DSENZ. Additionally, the circuit need not be enlarged.

Second Embodiment

Figure 7:
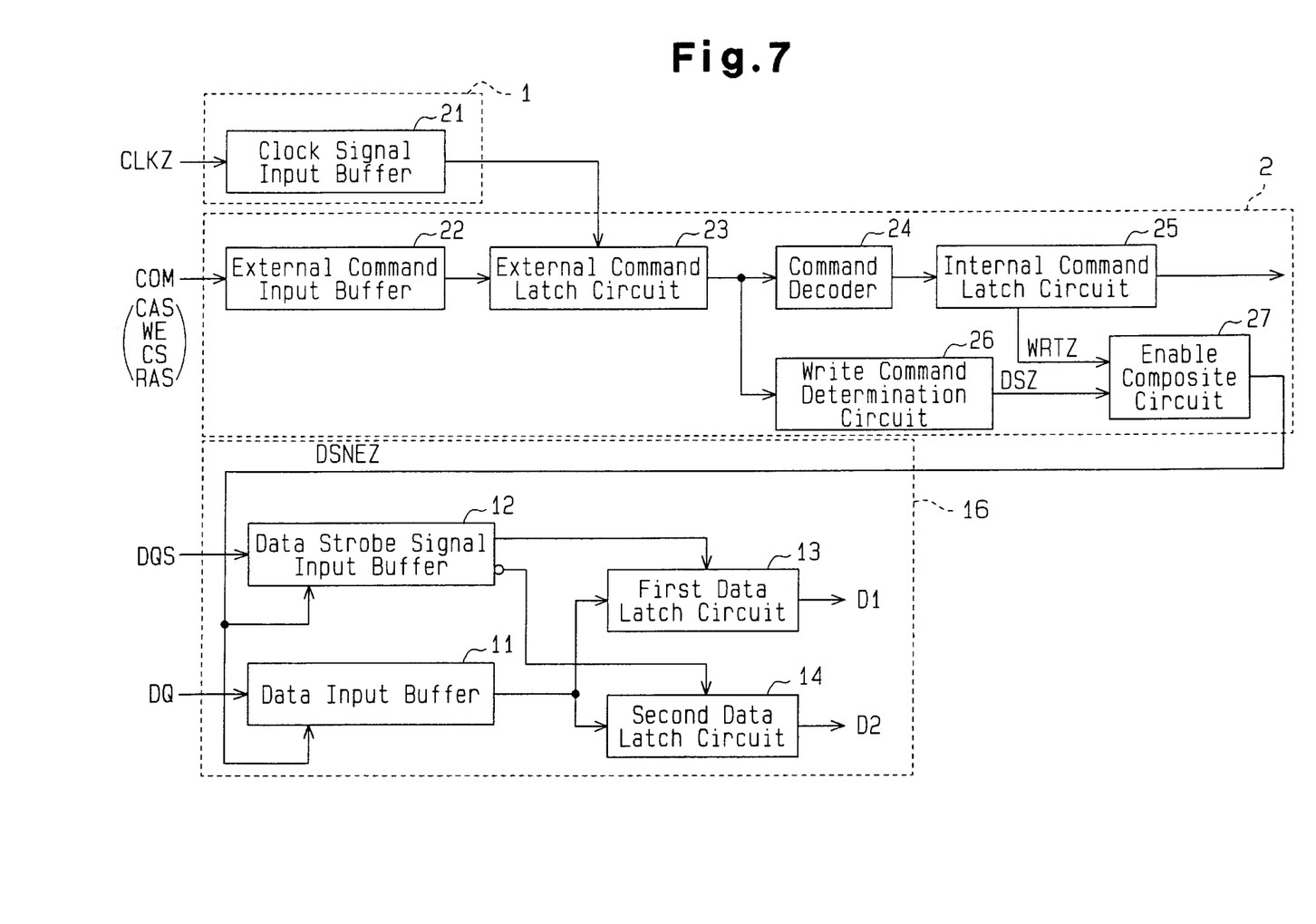
FIG. 7 is a schematic block diagram showing a write data input circuit according to a second embodiment of the present invention.

As shown in FIG. 7, the write command determination circuit 26 may receive an external command COM which is latched by the external command latch circuit 23. In this case, the timing for providing the external command COM to the write command determination circuit 26 is delayed by the external command latch circuit 23. However, the delay time (latch time) Td2 is only about two nanoseconds. Accordingly, the generating time DT1 of the enable signal DSENZ corresponds to the sum of the delay time Td1 of the external command input buffer 22, the delay time Td2 of the external command latch circuit 23, the delay time Td5 of the write command determination circuit 26, and the delay time Td6 of the enable composite circuit 27. Accordingly, the generating time DT1 is obtained as described below.

$$DT1 = Td1 + Td2 + Td5 + Td6$$
$$= 2 + 2 + 1 + 0.5$$
$$= 5.5 \text{ (nanoseconds)}$$

In other words, the enable signal DSENZ is provided to the input buffers 11, 12 within the same time as the first and second guarantee time Ta, Tb (5.5 nanoseconds). This guarantees the operation of the input buffers 11, 12 and the data latch circuits 13, 14.

Third Embodiment

Figure 8:
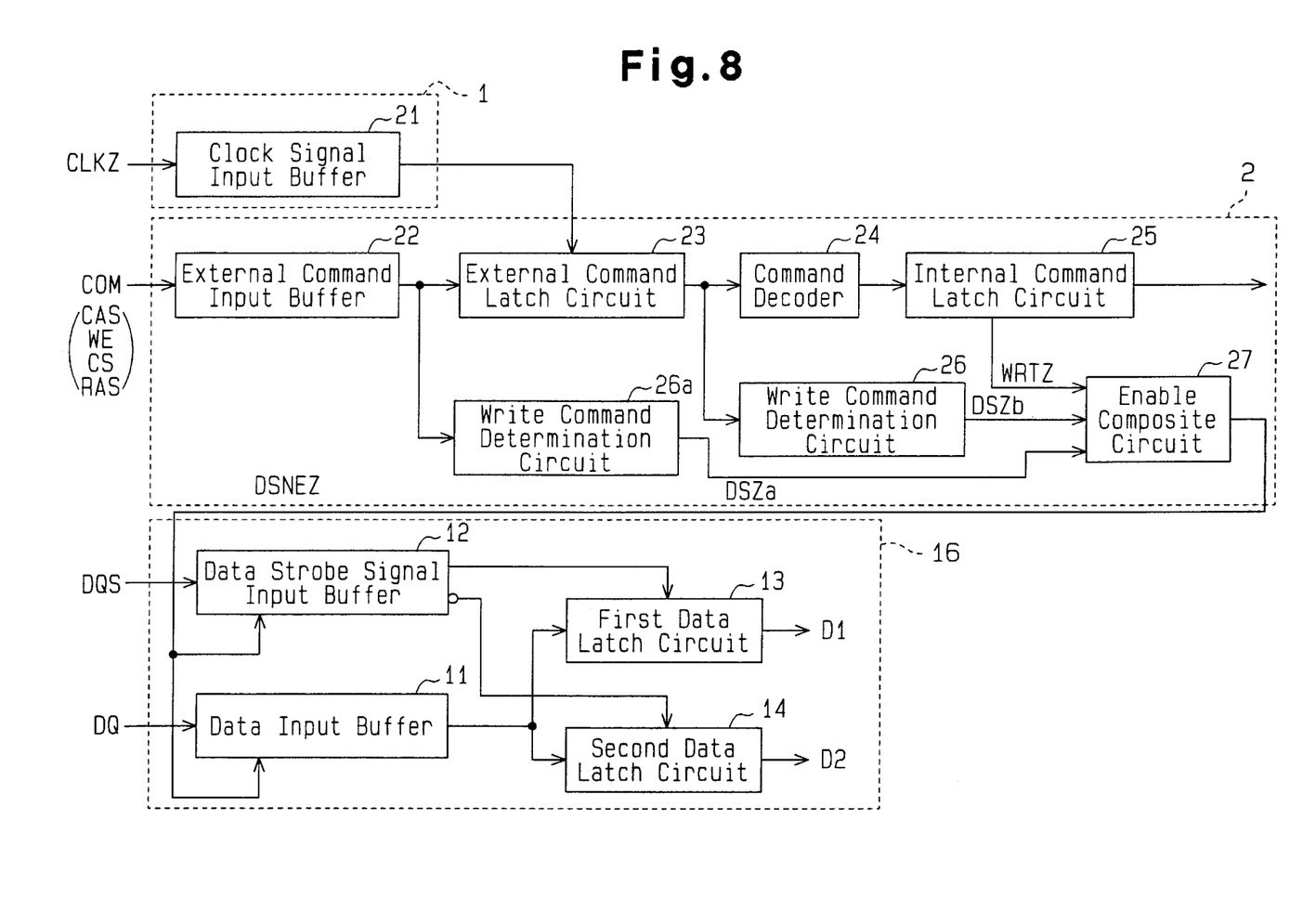
FIG. 8 is a schematic block diagram showing a write data input circuit according to a third embodiment of the present invention.

As shown in FIG. 8, the command decoder circuit 2 may include two write command determination circuits 26a, 26b. The write command determination circuit 26a receives an external command COM from the external command input buffer 22 and outputs a first write enable signal DSZa. The write command determination circuit 26b receives the external command COM latched by the external command latch circuit 23 and outputs a third write enable signal DSZb when the latched external command COM is a write command. The enable composite circuit 27 receives the write enable signals DSZa, DSZb, WRTZ.

In this case, the generating time DT1 of the enable signal DSENZ is determined by the first write enable signal DSZa. Further, the enable signal DSENZ is continuously generated by the following third write enable signal DSZb. This keeps the enable signal DSENZ high even if the first write enable signal DSZa is invalidated. Accordingly, the enable signal DSENZ remains high even if the first write enable signal DSZa is invalidated until the second write enable signal WRTZ is output.

Fourth Embodiment

In each of the above embodiments, the write enable signals DSZ, DSZa, DSZb may be provided to the input buffers 11, 12 as the enable signal DSENZ without going through the enable composite circuit 27. This further advances the activating timing of the input buffers 11, 12.

Fifth Embodiment

In each of the above embodiments, the second write enable signal WRTZ may be eliminated. In this case, a holding circuit that holds the enable signal DSENZ (first write enable signal DSZ) over a predetermined time period is required to activate the input buffers 11, 12 during the time necessary to perform the writing operation.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A semiconductor memory device comprising:
   a command input buffer that receives an external control signal to output an internal control signal;
   an external command latch circuit connected to the command input buffer, which latches the internal control signal synchronous with a clock signal to output a control latch signal;
   a decoder connected to the external command latch circuit, which decodes the control latch signal to generate a command;
   a write command determination circuit that receives one of the internal control signal and the control latch signal and generates a first enable signal when the external control signal indicates a write operation; and
   a data strobe input buffer that is activated in response to the first enable signal and receives a data strobe signal.

2. The semiconductor memory device according to claim 1, further comprising an internal command latch circuit connected to the decoder, which receives the command and generates a second enable signal when the command is a write command.

3. The semiconductor memory device according to claim 2, further comprising a composite circuit connected to the write command determination circuit and the internal command latch circuit, which receives the first and second enable signals to output a composite enable signal to the data strobe input buffer.

4. The semiconductor memory device according to claim 3, the composite circuit includes an OR circuit.

5. The semiconductor memory device according to claim 1, wherein the data strobe input buffer outputs a data sampling signal, and the device further comprising:
   a data input buffer that is activated in response to the first enable signal and receives data; and
   a data latch circuit connected to the data input buffer, which latches the data in accordance with the data sampling signal.

6. The semiconductor memory device according to claim 5, wherein the data sampling signal is provided to the data latch circuit, a predetermined time period after the internal control signal is latched by the external command latch circuit.

7. The semiconductor memory device according to claim 6, wherein the data latch circuit comprises first and second data latch circuits, the first data latch circuit latches data from the data input buffer in response to a rising of the data sampling signal, and the second data latch circuit latches data from the data input buffer in response to a falling of the data sampling signal.

8. The semiconductor memory device according to claim 1, further comprising a second write command determination circuit that receives the control latch signal.

9. The semiconductor memory device according to claim 1, further comprising a data input buffer that receives data and is activated in response to the first enable signal.

10. A semiconductor memory device comprising:
    a command input buffer that receives an external control signal to output an internal control signal;
    an external command latch circuit connected to the command input buffer, which latches the internal control signal synchronous with a clock signal to output a control latch signal;
    a decoder connected to the external command latch circuit, which decodes the control latch signal to generate a command;
    an internal command latch circuit connected to the decoder, which latches the command;
    a write command determination circuit that receives one of the internal control signal and the control latch signal and generates a first enable signal when the external control signal indicates a write operation;
    a data strobe input buffer that is activated in response to the first enable signal and receives data strobe signal; and
    a data input buffer that is activated in response to the first enable signal and receives a data signal.

11. The semiconductor memory device according to claim 10, wherein the internal command latch circuit generates a second enable signal when the command is a write command.

12. The semiconductor memory device according to claim 10, further comprising a composite circuit connected to the write command determination circuit and the internal command latch circuit, and receives the first and second enable signals to output a composite enable signal to the data strobe input buffer and the data input buffer.

13. The semiconductor memory device according to claim 12, wherein the composite circuit includes an OR circuit.

14. The semiconductor memory device according to claim 10, wherein the data strobe input buffer outputs a data sampling signal, and the device further comprising a data latch circuit connected to the data input buffer, which latches data from the data input buffer in accordance with the data sampling signal, a predetermined time period after the internal control signal is latched by the external command latch circuit.

15. The semiconductor memory device according to claim 14, wherein the data latch circuit comprises first and second data latch circuits, the first data latch circuit latches data from the data input buffer in response to a rising of the data sampling signal, and the second data latch circuit latches write data from the data input buffer in response to a falling of the data sampling signal.

16. The semiconductor memory device according to claim 10, further comprises a second write command determination circuits that receives the control latch signal.

17. A semiconductor memory device having an input pad comprising:

a command decoder that receives and decodes a control signal to output a command;

a transmission path from the input pad to the command decoder, for transmitting the control signal;

a write command determination circuit coupled to the transmission path to output an enable signal when the control signal indicates a write operation;

a data input buffer that receives data and is activated in response to the enable signal.

18. The semiconductor memory device according to claim 17, further comprising a data strobe input buffer that receives a data strobe signal and is activated in response to the enable signal.

19. The semiconductor memory device according to claim 17, further comprising:

a command latch circuit that latches the command to output a latched command; and an enable composite circuit that receives the enable signal and the latched command, wherein the enable composite circuit provides a composite enable signal to the data input buffer in response to the enable signal, and wherein an active condition of the composite enable signal is maintained until the latched command is reset.

* * * * *